United States Patent [19]

Butler

[11] Patent Number: 4,566,839

[45] Date of Patent: Jan. 28, 1986

[54] SEMICONDUCTOR WAFER DIFFUSION BOAT AND METHOD

[75] Inventor: Robert M. Butler, Tempe, Ariz.

[73] Assignee: Microglass, Inc., Syracuse, N.Y.

[21] Appl. No.: 544,588

[22] Filed: Oct. 24, 1983

Related U.S. Application Data

[63] Continuation-in-part of Ser. No. 495,642, May 18, 1983.

[51] Int. Cl.[4] .............................................. B65G 65/00
[52] U.S. Cl. .................................... 414/404; 414/417; 414/786; 432/259; 269/903; 211/41; 206/454; 118/500; 118/728
[58] Field of Search ....................... 414/404, 417, 786; 118/500, 728; 206/448, 454; 156/613; 211/41; 432/258, 259; 269/296, 903; 198/649

[56] References Cited

U.S. PATENT DOCUMENTS

| | | | |
|---|---|---|---|
| 3,534,862 | 10/1970 | Shambelan | 211/41 |
| 3,850,296 | 11/1974 | Hirata et al. | 118/500 X |
| 3,926,305 | 12/1975 | Wallestad | 118/500 X |
| 3,949,891 | 4/1976 | Butler et al. | 118/500 X |
| 4,449,885 | 5/1984 | Hertel et al. | 414/417 X |
| 4,466,766 | 8/1984 | Geren et al. | 414/404 |
| 4,471,716 | 9/1984 | Milliren | 206/454 X |

Primary Examiner—Joseph E. Valenza
Assistant Examiner—David A. Bucci
Attorney, Agent, or Firm—Cahill, Sutton & Thomas

[57] ABSTRACT

A quartz diffusion boat for carrying semiconductor wafers during very high temperature semiconductor manufacturing operations includes first and second quartz rails having first and second sets of wafer supporting grooves, respectively. Each wafer supporting groove of the first set includes a steeply inclined surface that contacts one point of an edge of a first face of a wafer, urging a peripheral portion of the opposite second face of that wafer against an opposite flat vertical wall of that groove. The steeply inclined surface of a corresponding wafer supporting groove of the second set contacting one point of an edge of the second face of the same wafer urges a peripheral portion of the first wafer face against an opposite flat vertical wall of the second groove. The wafers are prevented from tilting away from either flat vertical wall and therefore are held precisely parallel in the wafer supporting grooves. Rattling the wafers during movement of the boat, and resulting production of silicon dust and quartz dust is avoided.

11 Claims, 23 Drawing Figures

SEMICONDUCTOR WAFER DIFFUSION BOAT AND METHOD

RELATED APPLICATIONS

This is a continuation-in-part of my pending patent application "SEMICONDUCTOR WAFER TRANSFER APPARATUS AND METHOD", Ser. No. 495.642, filed May 18, 1983.

BACKGROUND OF THE INVENTION

The invention relates to boats, such as quartz "diffusion boats" for carrying semiconductor wafers during various high temperature semiconductor processing steps, such as diffusion and thermal oxidation.

It is well known that numerous cleaning, coating and diffusion operations are required in the fabrication of semiconductor wafers, and that often fifty-wafer quartz boats are used, wherein there is three/thirty-seconds (3/32) of an inch center-to-center spacing between the wafers for diffusion operations, whereas for most other cleaning operations, plastic twenty-five wafer carriers, such as one manufactured by Fluoroware, Inc. of Chaska, Minn., have three sixteenths (3/16) of an inch center-to-center spacing between wafers. The plastic wafer carriers also have long vertical side grooves or wafers guides, the bottoms of which are approximately one hundred mils wide and the sides of which are tapered outwardly by approximately two degrees. It is also known that all of the prior quartz boats cause generation of a certain amount of "silicon dust" that is highly undesirable in semiconductor manufacturing operations. The most efficient, highest yield semiconductor manufacturing facilities include expensive equipment and require extensive precautions on the part of workers to maintain the wafer fabrication environment at the highest possible level of purity. For example, expensive laminar air flow systems, and expensive dust filters often are used. The most modern facilities completely eliminate use of tweezers and manual handling of wafers in order to reduce the amount of silicon dust that is produced, and all workers wear clean gowns, hair nets, and in some cases, even face masks. However, due to build-up of static electricity on various wafer handling components, even small amounts of silicon dust can become attached to wafer surfaces or surfaces that touch wafers. For example, silicon dust can become attached to the sides of the grooves of the above-mentioned plastic wafer carriers, and when the wafers are transferred into such carrier, the peripheral portion of the active face of the wafer may slide against such silicon dust, causing defects in one or quite a few peripheral circuits on the wafer. This, of course, reduces yield and increases the overall cost per unit of the circuits being manufactured.

The prior quartz diffusion boats cause generation of silicon dust and quartz dust because the wafer supporting grooves thereof generally have rectangular shapes in which the lower edges of the wafers rest. The wafers tend to "rattle" in these grooves as the boat is moved during semiconductor manufacturing operations. This rattling results in frictional sliding of edges of the wafers against the bottoms of the wafer supporting grooves, thereby causing the breaking off of minute particles of silicon and quartz, which then may adhere to surfaces of semiconductor wafers. This is known to cause defects in integrated circuits. Furthermore, the rectangular shaped wafer supporting grooves of prior quartz diffusion boats do not perfectly fit the rectangular grooves and therefore, it is necessary to have at least three grooves in three separate spaced rails to support each wafer so all wafers in the boat are precisely parallel. This requirement increases the cost of manufacture of diffusion boats, and limits the use of diffusion boats to only one diameter of semiconductor wafers.

Accordingly, it is an object of the invention to provide an improved boat for carrying semiconductor wafers during various semiconductor processing operations.

It is another object of the invention to provide an improved "high temperature" wafer boat which holds large wafers more precisely parallel than prior art diffusion boats to thereby increase the uniformity of various semiconductor processing operations.

It is another object of the invention to provide an improved semiconductor wafer supporting boat such as a diffusion boat which substantially eliminates generation of quartz dust, silicon dust and the like that occurs as a result of "rattling" of wafers as they are being transported in the boat during semiconductor manufacturing operations.

It is another object of the invention to provide an improved boat which operates effectively with minimum friction during use of the wafer transfer apparatus described in the above copending parent application.

SUMMARY OF THE INVENTION

Briefly described, and in accordance with one embodiment thereof, the invention provides a boat for carrying semi conductor wafers during semiconductor processing operations, the boat including first and second parallel spaced parallel rails each having a longitudinal axis, a first group of generally parallel wafer supporting grooves disposed in uniformly spaced relationship in an upper surface of the first rail, a second group of generally parallel wafer supporting grooves disposed in uniformly spaced relationship in an upper surface of the second rail, each wafer supporting groove of the first group being aligned with a corresponding wafer supporting groove of the second group to cooperate therewith and engaging lower edge portions of a semiconductor wafer to support that wafer, wherein each groove of the first set has a steeply inclined surface on which an edge of a first face of a particular wafer rests, forcing a peripheral edge portion of an opposite second face of that wafer against a vertical flat surface of that groove. Each groove of the first set is aligned with a corresponding groove of the second set that also has a steeply inclined surface against which an edge of the second face of the wafer rests, forcing a peripheral edge portion of the first face of that wafer against a vertical flat surface of that groove. The vertical flat surfaces of all of the wafer supporting slots are precisely parallel, so that all of the wafers are held firmly and precisely parallel to each other and effectively resist any tilting and "rattling" during moving or handling of the boat. The boat can be composed of quartz, silicon carbide, polycrystalline silicon, for use in high temperature operations, or plastic or other materials for low temperature wafer processing operations.

DESCRIPTION OF THE INVENTION

The diffusion boat of the present invention is shown in FIGS. 13-16. This improved diffusion boat can be used in conjunction with any manufacturing operation in which diffusion boats are commonly used, but is especially advantageous and well adapted to use in conjunction with the wafer transfer apparatus disclosed in the previously mentioned parent application. Therefore, before going on to a detailed description of the diffusion boat of FIGS. 13-16, the structure and operation of the above-mentioned wafer transfer apparatus and method first will be set forth, as follows.

Before describing the structure of the wafer transfer apparatus, it will first be helpful to describe in detail the structure of the above-mentioned plastic carrier and the above-mentioned quartz diffusion boat between which the wafers are to be transferred.

Figures 1, 2, 3:
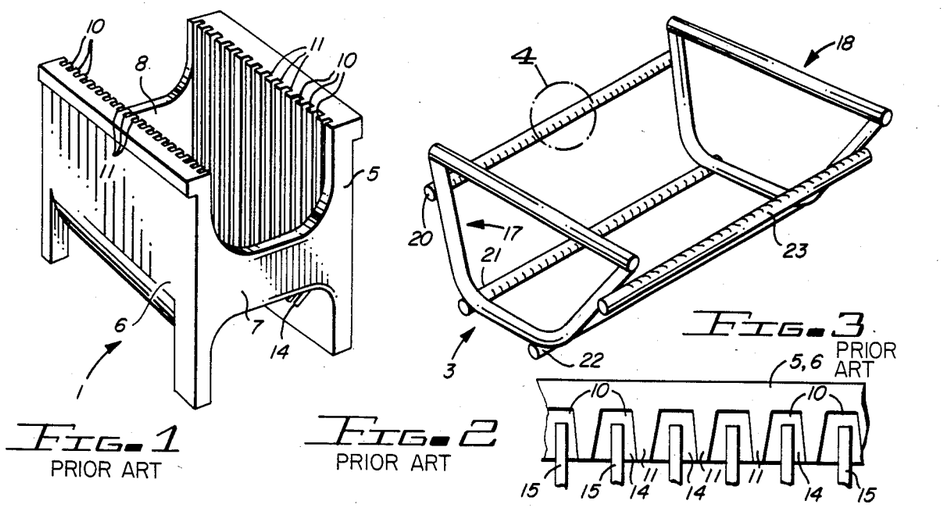
FIG. 1 is a partial perspective view of a plastic 25-wafer carrier which is used in conjunction with the quartz boat of the invention.
FIG. 2 is a sectional view illustrating the wafer guide grooves in the wafer carrier of FIG. 1.
FIG. 3 is a perspective view of a prior art quartz 50-wafer diffusion boat.

Referring now to FIG. 1, a typical prior art plastic wafer carrier 1 is shown. In order to understand the operation and advantages of the wafer transfer apparatus and method of the present invention, it is necessary to understand in detail the structure of plastic carrier 1, and also the structure of quartz diffusion boat 3 of FIG. 3, since it is these two carriers between which the wafer transfer apparatus of the present invention effectuates exchange of silicon semiconductor wafers. The silicon wafers are typically roughly 10 to 30 mils in thickness, and typically have diameters of 5 or 6 inches. Referring now to FIGS. 1 and 2, plastic carrier 1 includes an open frame having first and second vertical sides 5 and 6 connected by two end sections 7 and 8. Side 5 has 25 interior grooves 10, each separated by a ridge 11. The sides of each vertical groove 10 are tapered slightly, roughly 2°. The width of each groove is approximately ⅛ inch. At the bottom of each vertical groove 10 is a steeply sloped bottom surface 14. The sloped surfaces 14 engage the edges of wafers 15 to support them and prevent them from falling through the open interior of plastic carrier 1. Twenty-five grooves 10 also are formed in the interior wall of sides 6 of plastic carrier 1. Each of these twenty-five grooves 10 in wall 6 is exactly opposite to a corresponding groove 10 on the interior wall of side 5.

Figures 4, 5, 6:
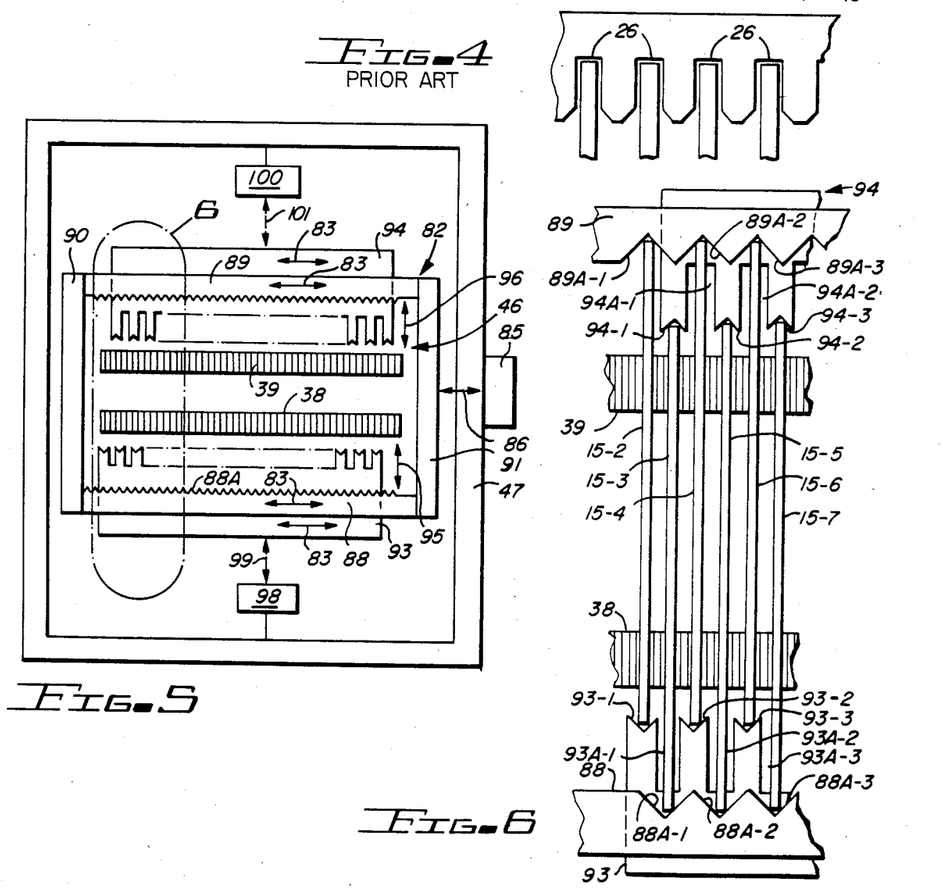
FIG. 4 is an enlarged view of detail 4 of FIG. 3.
FIG. 5 is a diagram of a top view of the wafer holding region of the transfer apparatus.
FIG. 6. is a diagram of detail 6 of FIG. 5 enlarged and modified to illustrate holding of wafers in a shiftable head mechanism in FIG. 5.

Referring now to FIGS. 3 and 4, a typical 50-wafer quartz diffusion "boat" 3 is shown. Quartz boat 3 includes two parallel end pieces 17 and 18 which are connected together by four quartz rails 20, 21, 22, and 23, the ends of which are welded to side and bottom portions of end pieces 17 and 18. End pieces 17 and 18 also are composed of quartz rod material. As illustrated in FIG. 4, which is an enlargement of detail 4 of FIG. 3, each of the quartz rails 20, 21, 22, and 23 has 50 grooves 26 therein. Each of the 50 grooves of each rail is precisely aligned with a corresponding groove that has been sawed in each of the other 3 rails, so that each circular wafer rests quite precisely in those 4 aligned grooves.

The center-to-center spacing between each of the grooves 10 in plastic carrier 1 is 3/16 of an inch. The center-to-center spacings of the grooves 26 of quartz boat 3 are 3/32 of an inch. The length of plastic carrier 1 is approximately equal to the length of quartz boat 3.

Figures 7, 8:
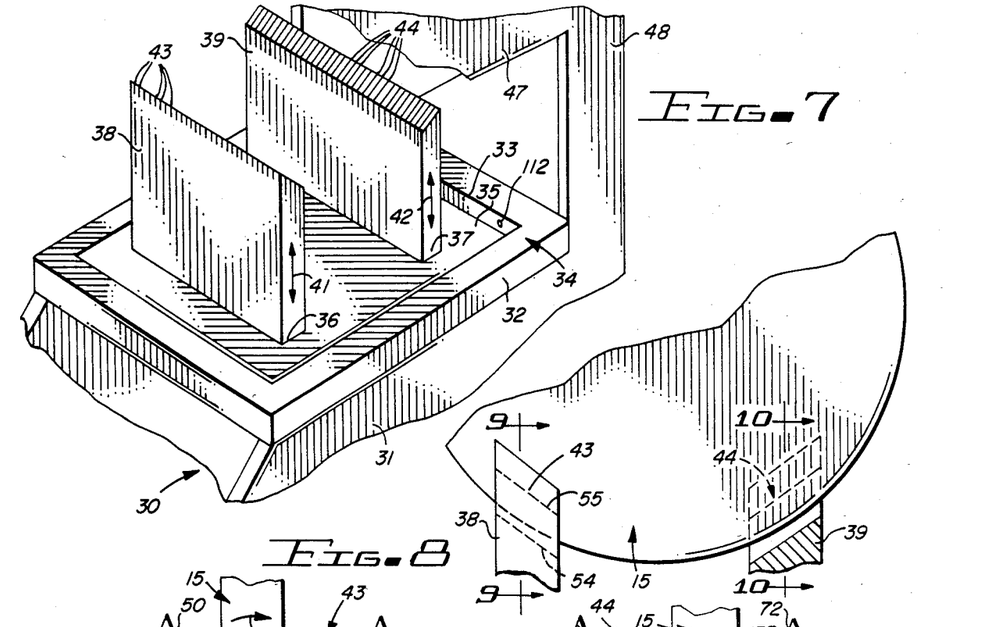
FIG. 7 is a partial perspective view illustrating a stand on which the carriers of FIGS. 1 and 3 can be placed and a wafer elevator mechanism.
FIG. 8 is a partial elevational view illustrating the elevator elements of FIG. 7 holding a semiconductor wafer.

With the foregoing information in mind, part of the structure of wafer transfer system 30 of the present invention is shown in FIG. 7. Wafer transfer system 30 includes a base 31 which rests on a table top (not shown). A "stand" for supporting either quartz load 3 or plastic carrier 1 includes a rectangular frame 32. Frame 32 has a vertical interior wall 33 that surrounds a floor surface 35 having two elongated rectangular apertures 36 and 37 therein. The inner dimensions and features of frame 32 are selected to precisely accommodate the base of wafer carrier 1 and also the bottom rails 21 and 22 of diffusion boat 3.

Two wafer elevator members 38 and 39 can be extended upward out of and receded into rectangular opening 36 and 37, respectively. The two elevator members 38 and 39 move simultaneously upward and downward in synchronization in the directions indicated by arrows 41 and 42, respectively. Each of elevator members 38 and 39 (hereinafter simply elevators 38 and 39) has 50 wafer-supporting elevator grooves therein. More specifically, reference numeral 43 designates the wafer-supporting grooves in elevator member 38 and reference numeral 44 designates the 50 wafer supporting grooves in elevator 39. The structure of the foregoing wafer-supporting grooves constitutes an important aspect of the present invention, and the structure of these grooves will be described in detail with reference to FIGS. 8, 9 and 10.

Referring to FIG. 8, it can be seen how a particular semiconductor wafer 15 is supported by a particular wafer-support groove 43 of elevator 38 and a corresponding, directly opposed wafer-supporting groove 44 in elevator member 39. In FIG. 8, it can be seen that wafer 15 is held vertically by the two wafer-supporting grooves 43 and 44. In accordance with the present invention, the structure of the wafer-supporting grooves is such that all of the wafers 15 are held very precisely vertical and parallel. It will be appreciated that this is an advantage when it is realized that the two elevators 38 and 39 are initially receded into floor openings 36 and 37 before a plastic carrier such as 1 in FIG. 1 with 25 wafers such as therein is precisely positioned on floor 35 (FIG. 7) of wafer transfer system 30. Features of frame 32 in floor 32 (not shown) assure precise and proper positioning of the support legs of plastic carrier 1 on floor 35 so that alternate wafer-supporting grooves 43 and 44 are precisely aligned with the 25 wafers being supported in grooves 10 of plastic carrier 1. During the wafer transfer operation the elevators 38 and 39 slowly are raised upward into the interior of plastic carrier 1 so that the alternate wafer-supporting grooves 43 and 44 engage the lower edge portions of the respective wafers and lift them upward into a wafer holding region 46 surrounded by a frame 47, which is supported above stand 34 by two vertical side members 48.

As previously explained, silicon dust that may be present in a wafer processing environment may adhere to the surface of the wafer or to the sides of the wafer grooves 10 in plastic carrier 1. It is highly desirable that as the wafers 15 are raised out of plastic carrier 1 there be no sliding of the peripheral edges of the wafers against the walls of grooves 10, since such sliding would cause any adherent silicon dust to scratch the wafer surface and thereby produce defects in the integrated circuits being formed thereon.

Figure 9:
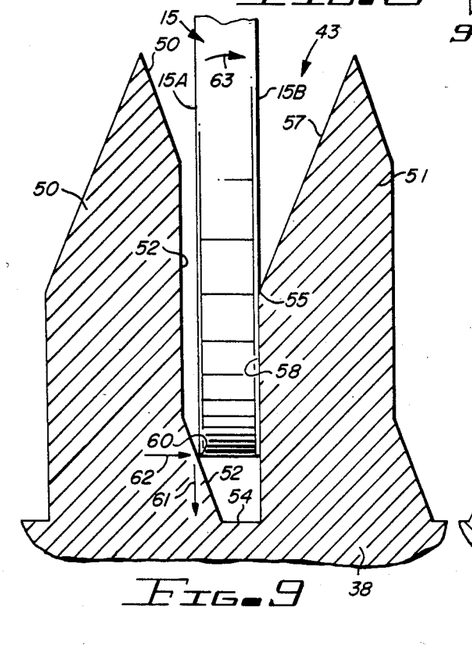
FIG. 9 is a partial section diagram taken along section lines 9—9 of FIG. 8, illustrating a wafer supporting groove of one of the elevator elements of FIG. 8 holding a semiconductor wafer.

Referring now to FIG. 9, it is seen that a particular one of wafer-supporting grooves 43 includes a side 50 and a side 51. Wafer 15 has a face 15A and an opposite face 15B. Side 50 of wafer-supporting groove 43 includes an inclined face 50, a vertical face 51, and a lower inclined surface 52 that extends from a line 55 (FIG. 8) to a bottom 54 of groove 43. Side 51 of wafer-supporting groove 43 has an upper inclined wall 57 that extends downward to a vertical wall 58. Vertical wall 58 is perfectly flat and is the only portion of wafer-supporting groove 43 that directly contacts the peripheral portion of major surface 15B of wafer 15. In the present embodiment of the invention, the height of the portion of vertical wall 58 is only approximately 0.1 inch. The slope of inclined surface 52 is approximately 20 degrees from vertical.

It can be seen that the width of wafer 15, which is narrower than the distance between walls 51 and 58 but wider than the width of bottom 54, causes wafer 15 to have its outer edge 60 rest on steeply inclined surface 52 of groove 43. Arrow 61 represents the downward force of the weight of wafer 15 on surface 52. Due to the steep inclination of surface 52, wafer 15 tends to slide to the right in groove 43, producing a horizontal force component designated by reference numeral 62 in FIG. 9. This horizontal force component maintains wafer surface 15B tightly against vertical surface 58 of groove 43. It can be readily seen in FIG. 9 that any tendency of wafer 15 to rock in the direction of arrow 63 will be strongly resisted by vertical surface 58, since a great deal of force would be required to force the upper portion of wafer 15 to the right enough to cause its lower edge to overcome the frictional forces on inclined surface 52 and vertical surface 58 and slide upward along inclined surface 52.

Figure 10:
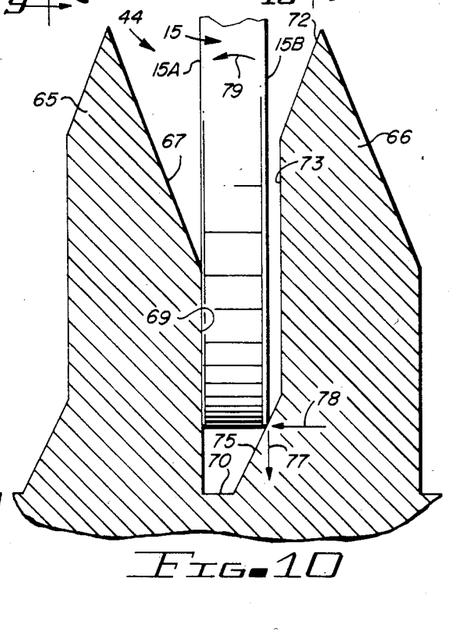
FIG. 10 is a partial section view taken along section line 10—10 of FIG. 8, illustrating the wafer supporting groove of the opposite elevator element of FIG. 8 holding the same wafer as the groove of FIG. 9.

Referring now to FIG. 10, the structure of the directly opposed wafer-supporting groove 44 in which another portion of the same wafer 15 is supported is described in detail. Groove 44 has a side 65 and a side 66. Side 65 has a steeply inclined surface 67 and a precisely vertical lower surface 69, analogous to surface 58 of FIG. 9, that extends from the junction with surface 67 to the bottom 70 of groove 44. Side 66 of groove 44 has an upper inclined surface 72 which extends down to a vertical surface 73. Vertical surface 73 extends down to a lower steeply inclined surface 75, which is analogous to surface 52 of FIG. 9, and which extends to the bottom of groove 70. In the manner previously described with reference to groove 43, the weight of wafer 15 produces a downward force component 77 on inclined surface 75, causing surface 15A of wafer 15 to be pressed tightly precisely against vertical side 69 of groove 44. The resulting horizontal force component is designated by reference numeral 78 in FIG. 11.

It can be readily seen that the abutment of face 15A of wafer 15 against vertical surface 69 of groove 44 strongly resists any forces tending to rock wafer 15 in the direction indicated by arrow 79 in FIG. 10.

It can be seen that the two directly opposed wafer-supporting grooves 43 and 44 precisely hold wafer 15 in a vertical position and strongly resist any forces tending to tilt the wafer toward either side of either groove, since one precision flat surface 58 abuts one face 15B of wafer 15 and another precision flat surface 69 precisely abuts the opposite face 15A of that same wafer.

Thus, it is seen that the portion of wafer transfer system 30 described up to now has the capability of precisely lifting 25 wafers out of a plastic carrier such as 1 (FIG. 1) properly positioned on stand 34 and also has the capability of lifting 50 wafers out of a quartz boat such as 3 (FIG. 3) that is properly positioned on stand 34.

Since the grooves 10 of plastic carrier 1 are considerably wider than the wafers usually held therein, the alternate wafer-supporting grooves on elevators 38 and 39 have wider upper dimensions (not shown) than the even numbered wafer-supporting grooves to ensure that wafers lifted from plastic carrier 1 do not accidentally get positioned in even numbered wafer-supporting grooves. This technique works well because the 50 grooves in each rail of quartz boat 3 are narrower (typically 32 mils) and are more precisely positioned than the grooves 10 of plastic boat 1.

Now referring to FIG. 5, the structure of the mechanism associated with wafer holding region 46 supported by frame 47 (also see FIG. 7) will be described. A horizontally shiftable head mechanism 82 is supported within rectangular frame 47, and can be laterally shifted in the direction indicated by arrows 83 by a distance equal to 3/32 of an inch, which is the center-to-center spacing between the grooves in quartz boat 3. The support and lateral shifting of head 82 is accomplished by means of a pneumatic cylinder mechanism 85 and a mechanical coupling 86, details of which are omitted, but can be readily implemented by those skilled in the art.

Head mechanism 83 includes a first retainer block 88, a second retainer block 89, and two end plates 90 and 91 forming a rectangular frame that encloses wafer-holding region 46. The view shown in FIG. 5 is a top view looking down into wafer transfer system 30 from above wafer holding region 46. It can be seen that elevators 38 and 39 previously described can be raised up into wafer holding region 46. The height of first and second retainer blocks 88 and 89 is approximately two inches.

First retainer block 88 has 25 vertical V-shaped grooves 88A, each of which is approximately two inches long.

The retainer block grooves 88A have center-to-center spacings of 3/16 of an inch. Similarly, second retainer block 89 has 25 vertical V-shaped grooves 89A, each of which is also approximately two inches in length. First retainer block 88 and second retainer block 89 are disposed at the same elevation in head mechanism 82. The first retainer block grooves 88A are laterally offset by 3/32 of an inch relative to second retainer block grooves 89A.

Head mechanism 82 also includes a first retainer 93 and a second retainer 94. First retainer 93 is disposed beneath first retainer block 88, and is movable independently of retainer block 88 in the directions designated by arrow 95, but is in fixed relationship to first retainer block 88 with respect to movement in the direction indicated by arrows 83. Similarly, second retainer 94 is independently movable in the directions designated by arrows 96, but does not move in the direction of arrows 83 except when the entire wafer-holding head 82 moves in those directions.

The relative vertical positions of retainer block 88 and 89, retainers 93 and 94, stand 34, and elevators 38 and 39 can be seen from the diagrams in FIGS. 11A and 11B, which are subsequently referred to in describing the operation of wafer transfer system 30.

The independent movement of first retainer 93 in the direction of arrows 95 is effectuated by means of a pneumatic mechanism 98 and a mechanical coupling 99 of pneumatic mechanism 98 to first retainer 93. The details of this implementation, including the pneumatic cylinders and the way guides in which first retainer 93 slides can be readily implemented by those skilled in the art and are therefore omitted. Similarly, pneumatic mechanism 100 and mechanical coupling 101 effectuate movement of second retainer 98 in the direction of arrows 96.

First retainer 93 has 25 sloped V-shaped grooves 93-1, 93-2, 93-3, etc. Between each pair of V-shaped grooves 93-1, 93-2, etc. is a relatively deep slot 93A01, 93A02, 93A03, etc. which allow raising and lowering of alternate wafers that are not supported by V-shaped grooves 93-1, 93-2, etc.

Similarly, second retainer 94 has 25 sloped V-shaped grooves 94-1, 94-2, 94-3, etc. and slots 94A-1, 94A-2, etc. disposed respectively therebetween.

Each of the 25 V-shaped grooves 93-1 is aligned with a corresponding one of the V-shaped grooves 89A of rear retainer block 89. Thus, with first retainer 93 and second retainer 94 both extended into wafer holding region 46, V-shaped grooves 93-1 and 89A-1 can support a silicon wafer 15-2. V-shaped grooves 94-1 and 88A-1 can support a wafer 15-3, slot 93A-1 accommodating the forward portion of that wafer. Grooves 93-2 and 89A-2 can support a wafer 15-4, slot 94A-1 accommodating the rear portion of that wafer. Wafer 15-5 is supported by grooves 94-2 and 88A-2, wafer 15-6 is supported by grooves 93-3 and 89A-3, and wafer 15-7 is supported by grooves 94-3 and 88A-3.

As will become clear subsequently, FIG. 6, which is an enlarged view of detail 6 of FIG. 5 is in the nature of a sectional view at the point in which the V-shaped grooves of the retainers 93 and 94 contact the edges of the various wafers. FIG. 11G best illustrates a side view that shows how retainers 93 and 94 and retainer blocks 88 and 89 support wafers in the wafer holding regions.

With the foregoing description of the structure in mind, FIGS. 11A-G and FIGS. 12A and 12B will be referred to explain how 25 wafers that are initially loaded in a first plastic carrier 1 and 25 additional wafers that are initially loaded in a second identical plastic carrier are transferred from those two plastic carriers into wafer holding region 46. Subsequently, after the second plastic carrier has been removed from stand 34 and replaced by quartz boat 3, the 50 wafers in holding region 46 are lowered into the 50 respective sets of slots in diffusion boat 3, completing that particular wafer transfer operation.

Figure 11A:
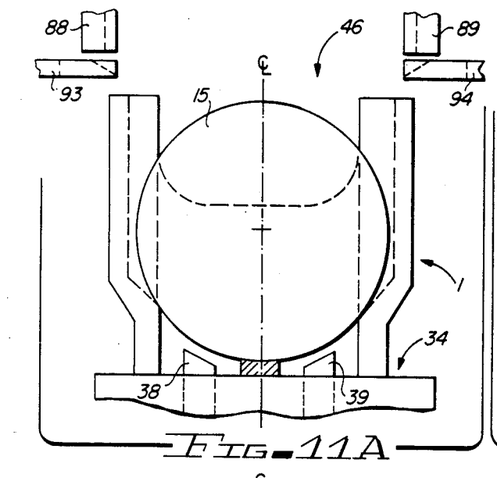
FIGS. 11A–11G, are diagrams useful in explaining several sequences of operation of the wafer transfer device of the present invention.
Figure 11B:
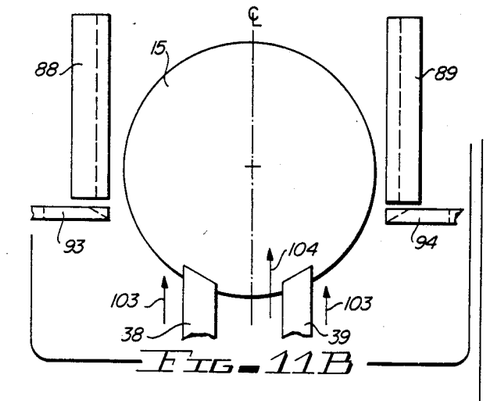

The first step in the foregoing process is to place the first plastic carrier 1 and 25 wafers therein on stand 34, as shown in FIG. 11A. At this point, elevators 38 and 39 are below the wafers 15 supported in first plastic carrier 1. Note that both first retainer 93 and second retainer 94 initially are receded from wafer holding region 46. Referring to FIG. 11B, the next step is to slowly raise elevators 38 and 39 in the direction indicated by arrows 103. The "odd numbered" wafer supporting grooves 43 and 44 of elevators 38 and 39, respectively, have widened upper portions, as previously explained, and the sloped edges (such as 50 and 57 in FIG. 9) guide the wafers 15 in plastic carrier 1 into the lower portions of the odd numbered wafer supporting grooves. At this point in the operation, the 25 wafers become positioned precisely vertically and move upward in the direction of arrow 104 (FIG. 11B) without touching any of the ridges 11 (FIG. 1) in plastic carrier 1.

Figure 11C:
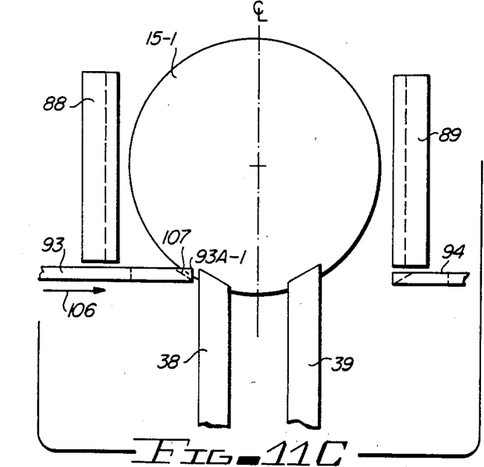

Referring now to FIG. 11C, elevator members 38 and 39 reach a maximum height, and first retainer 93 moves into wafer holding region 46 in the direction indicated by arrow 106. Elevators 38 and 39 begin to lower, so that the two edge points 107 of each of the wafers 15 engage corresponding V-shaped front retainer grooves such as 93A-1.

Figure 11D:
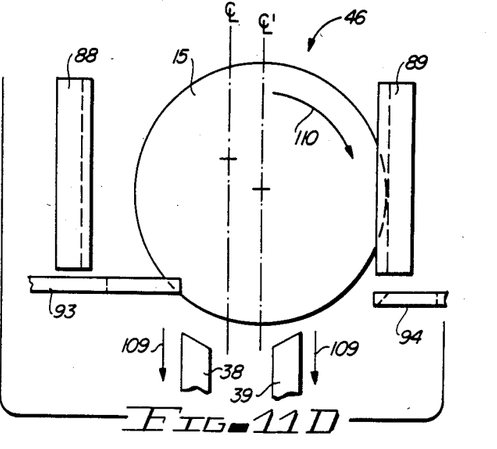
Figure 11E:
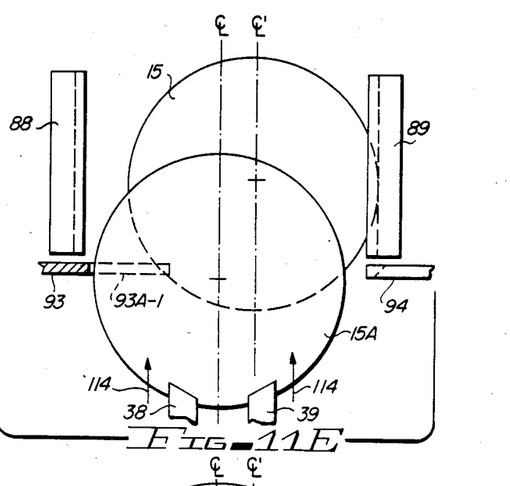

Referring now to FIG. 11D, as elevators 38 and 39 continue to move downward in the direction of arrows 109, the wafers 15 roll in the direction of arrow 110 so that their right hand edges (as shown in FIG. 11D) roll into and rest in the appropriate V-shaped grooves 89A-1, 89A-2, etc. of retainer block 89, thereby supporting all of the wafers 15 in the first plastic carrier 1 in wafer holding region 46.

Next, after elevators 38 and 39 have been lowered to their lowest position, the first wafer carrier 1 is removed from stand 34. In the preferred embodiment of the invention, a photosensor 112 (FIG. 7) detects the removal of one of the legs of plastic carrier 1 and causes the entire head mechanism 82, including front and rear retainer blocks 88 and 89 and front and rear retainers 93 and 94 to shift laterally 3/32 of an inch. Of course, this shifts the 25 wafers that are presently being held in wafer holding region 46 3/32 of an inch.

Figure 12A:
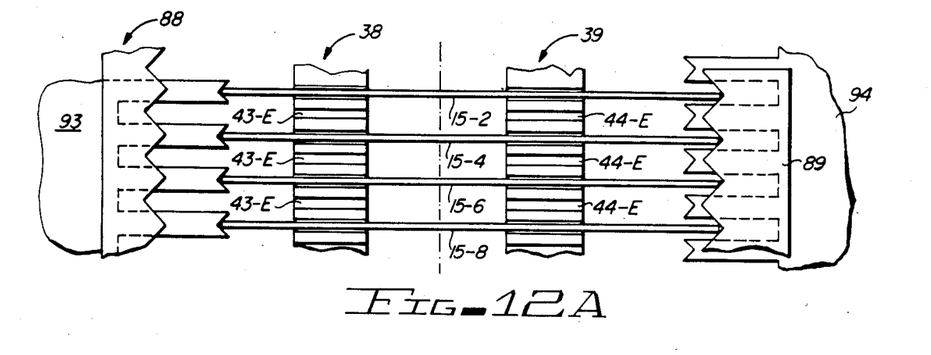
FIGS. 12A and 12B are top view diagrams useful in illustrating the shifting of the wafer holding head mechanism of FIG. 5 during a wafer transfer operation.

By way of definition, it will be assumed that the "odd numbered" wafer supporting grooves 43 and 44 are initially (before the above mentioned shift) aligned with the V-shaped grooves of first retainer 93 and second retainer block 89 and the "even numbered" wafer supporting grooves 43 and 44 are initially aligned with the V-shaped grooves of second retainer 94 and first retainer block 88. This results in the "even numbered" wafers, such as 15-2, 15-4, etc. from the first plastic carrier being supported by the V-shaped grooves of first retainer 93 and the V-shaped grooves of second retainer block 89, as shown in FIG. 12A.

Figure 12B:
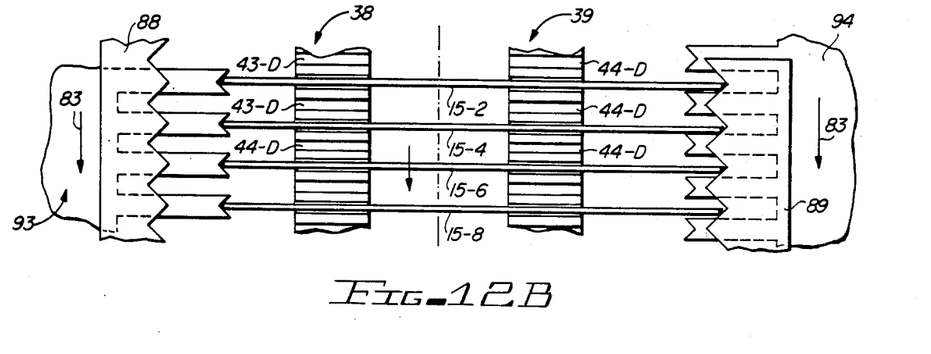

Then, the result of the above-mentioned shift of head mechanism 82, in the directions of arrows 83 (FIGS. 5 and 12B), is in alignment of the "even numbered" wafer supporting slots 43 and 44 with the V-shaped grooves of second retainer 94 and first retainer block 88. In FIGS. 12A and 12B, reference numerals 43-E and 44-E designate even numbered wafer supporting slots in elevator members 38 and 39, respectively, and reference numberals 43-D and 44-D represent odd numbered wafer supporting slots.

Thus, it can be seen that when the second plastic carrier and the second group of 25 wafers are used to repeat the previously described cycle of operation, the odd numbered wafer supporting slots 43-D and 44-D will now be positioned between the first group of wafers in holding region 46, as shown in FIG. 6.

Returning now to FIG. 11E, after the second plastic carrier has been positioned on stand 34, elevators 38 and 30 rise slowly in the direction of arrows 114. Second retainer 94 remains receded, but first retainer 93 remains extended into wafer holding region 46 in order to continue supporting the first group of wafers 15. Reference numeral 15A designates the second group of 25 wafers now being lifted by elevator members 38 and 39 from the second plastic carrier. The 25 wafers 15A pass through the respective slots such as 93A-1 in first retainer 93, between the wafers 15 and into wafer holding region 46.

Figure 11F:
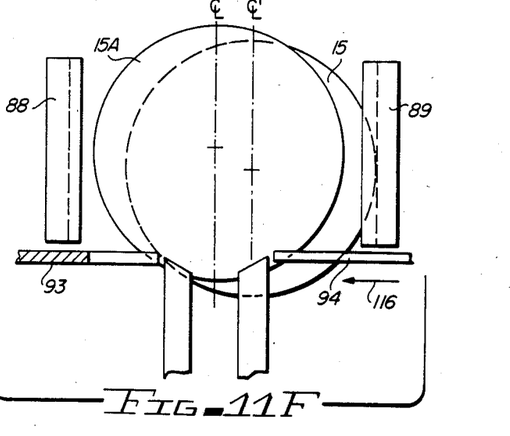
Figure 11G:
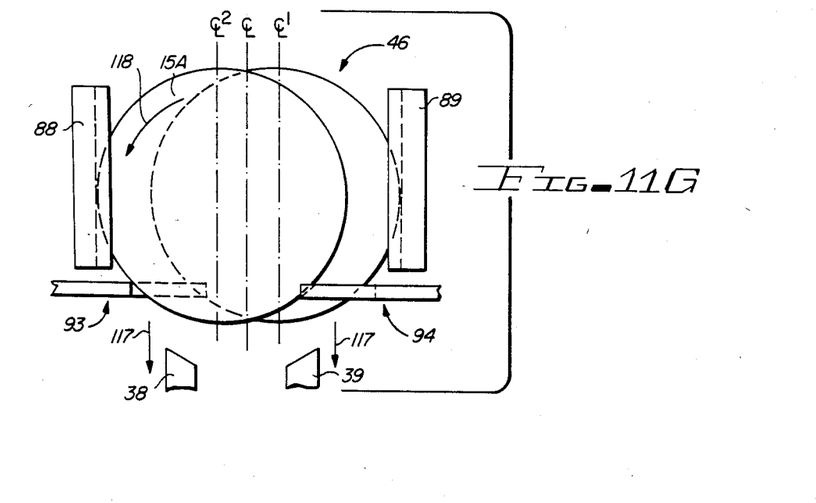

Referring now to FIG. 11F, after elevators 38 and 39 have reached their peak position, second retainer 94 moves in the direction of arrow 116 into wafer holding region 46. Referring now to FIG. 11G, elevators 38 and 39 move downward in the direction indicated by arrows 117, causing the 25 wafers 15A to roll in the direction of arrow 118, since the right-hand portion of the wafers rest in the respective V-shaped grooves such as 94-1, 94-2, etc. of retainer 94. The left edges of wafers 15A then come to rest in the respectively aligned V-shaped grooves 88A-1, 88A-2, etc. of front retainer block 88, leaving all fifty wafers suspended in wafer holding region 46.

The next step in the process is to lower elevators 38 and 39 to their lowest position and remove the second plastic carrier.

Next, quartz boat 3 is positioned on stand 34. A second optical detector (not shown) detects the presence of an end of one of the rails 21 or 22, producing a signal that causes head 82 to shift back to its original position, so that the V-shaped grooves of first retainer 93 and second retainer block 89 are aligned with the above-mentioned odd numbered wafer supporting slots. The elevators 38 and 39 rise so that all 50 of the wafer holding slots 43 and 44 engage and slightly raise the 50 wafers 15 and 15A presently suspended in wafer holding region 46. It is believed that this portion of the operation will be quite clear without use of further drawings, which therefore have been omitted. Then, the first and second retainers 93 and 94 are retracted out of wafer holding region 46, and the elevators 38 and 39 and the 50 wafers are slowly lowered. Since all 50 wafer holding slots 43 and 44 are aligned with the respective sets of grooves in the four horizontal rails of quartz boat 3, the 50 wafers are properly deposited into quartz boat 3, and the desired wafer transfer process has been completed.

Electronic control circuitry that is easily implemented by those skilled in the art or manual controls are actuated to accomplish the above-described lowering of elevators 38 and 39, the lateral shifting of head mechanism 82 and extension and retraction of the first and second retainers 93 and 94 and wafer holding region 46.

The entire operation requires approximately two minutes. No frictional contact of any of the wafer surfaces with the guide grooves of the plastic carriers 1 or the V-shaped grooves in the retainers 93 and 94 or the retainer blocks 88 and 89 has occurred during the lowering of elevators 38 and 39, thereby minimizing production of silicon dust particles. Any silicon dust particles that are produced as the wafer edges contact the V-shaped grooves immediately fall below the level of the wafers and are unlikely to adhere to the wafer surfaces or the surfaces of the wafer holding slots 43 and 44 or any of the V-shaped grooves, all of which are conductive metal, such as aluminum, and are coated with Teflon to avoid electrostatic charge build-up that might otherwise affect such silicon dust particles.

The wafer transfer procedure that is complementary to that described above, namely the transfer of 50 wafers from quartz boat 3 into two plastic carriers, is entirely analogous to that described above. Therefore, drawings illustrating this process have been omitted to avoid redundancy of illustration. However, for completeness, the basic steps of this transfer operation will be described. To begin the process, the quartz boat with 50 wafers therein is placed on stand 34. Optical sensing of the presence of the quartz boat on stand 3 effects any necessary shifting of head mechanism 82 to be sure that the odd numbered wafer supporting slots 43 and 44 are aligned with the V-shaped grooves of second retainer 94 and first retainer block 88. The elevators 38 and 39 rise, lifting the 50 wafers out of quartz boat 3 and into wafer holding region 46. The first and second retainers 93 and 94 then both are extended into wafer holding region 46. As the elevators 38 and 39 are lowered, the two groups each of 25 alternately positioned wafers roll into the configuration shown in FIG. 6 and FIG. 11G. Elevators 38 and 39 then are lowered to their minimum height, and the quartz boat 3 is replaced with the first plastic carrier. The elevators 38 and 39 rise through the interior of the first plastic carrier, lifting the 50 wafers a bit. The second retainer 94 is retracted from wafer holding region 46. Elevators 38 and 39 are lowered, and the 25 "odd numbered" wafers supported by the odd numbered wafer supporting slots 43 and 44 thereby pass through the deep slots (such as 93A-1, 93A-2, etc.) between the V-shaped grooves of first retainer 94 and are lowered into the first plastic carrier. Upon removal of the first plastic carrier, the head mechanism 82 laterally shifts 3/32 of an inch to align the V-shaped grooves of the first retainer 93 and second retainer block 89 and the remaining 25 wafers thereon. The second plastic carrier is placed on stand 34 Elevators 38 and 39 are raised. The first retainer 93 is retracted, and the second group of wafers is lowered into the second plastic holder. Thus, the second desired transfer has been completed.

Now that the wafer transfer apparatus has been described in detail, the wafer carrying boat of the present invention will be described. Referring to FIGS. 13-16, boat 120 includes a front rail 121 and a parallel back rail 122. Front rail 121 includes, in one embodiment of the invention, fifty equally spaced triangular grooves 126. Back rail 122 also includes 50 sloped triangular grooves 127. Each of the grooves 126 corresponds to and is aligned with a respective one of the grooves 127, so that each corresponding pair of grooves 126, 127 supports a large semiconductor wafer, which typically is 4, 5 or 6 inches in diameter and roughly 10 to 30 mils in thickness.

In accordance with the present invention, each of the grooves 126 and each of the grooves 127 has a generally triangular cross section. Each of the grooves 126 has a perfectly vertical right-hand wall and a sloped left-hand wall. Similarly, each of the grooves 127, as viewed from the front in FIG. 13, has a perfectly vertical left-hand wall and a sloped right-hand wall. The principle of operation of the grooves 126 and 127 in supporting a semiconductor wafer is exactly the same as previously described with reference to FIGS. 8, 9 and 10, which were described with reference to the wafer supporting grooves in elevator members 38 and 39.

Referring back to FIGS. 13–16, wafer supporting grooves 126 and 127 in rails 121 and 122, respectively, support wafer 128 as shown in FIGS. 14 and 16. As shown in the section view of FIG. 14, which is taken along section line 14-14 of FIG. 13, groove 126-1 in front rail 21 has its flat "left" wall 126A sloped at approximately 18 degrees (with respect to a line perpendicular to the plane of the bottom of boat 120.) (However, for different sized wafers, the slope could be in the range from 15 to 25 degrees.) Similarly, on rear rail 122, groove 127-1 has a flat, perfectly vertical left wall 127B. The upper portion of the left-hand wall of groove 127-1 is designated by reference numeral 127A and is sloped by approximately 20 degrees relative to flat vertical face 127B.

Figure 13:
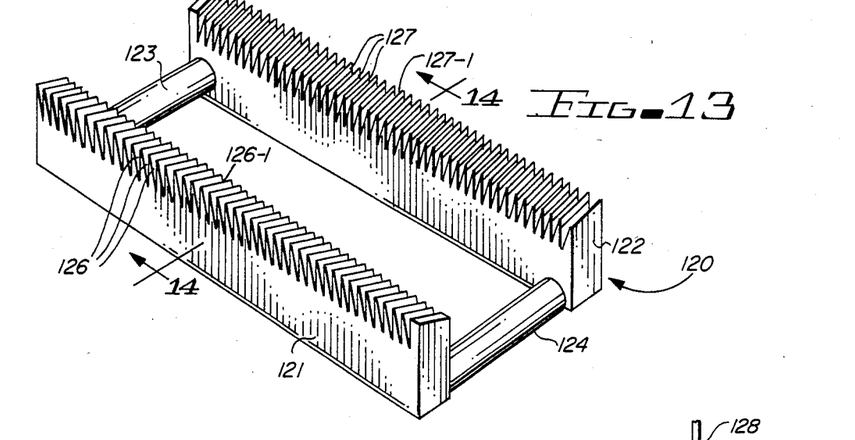
FIG. 13 is a perspective view of a quartz boat made in accordance with the present invention.
Figure 14:
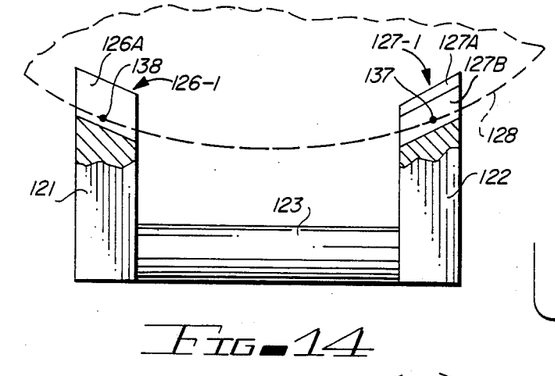
FIG. 14 is a partial cutaway section view useful in explaining the boat of FIG. 13.
Figure 15:
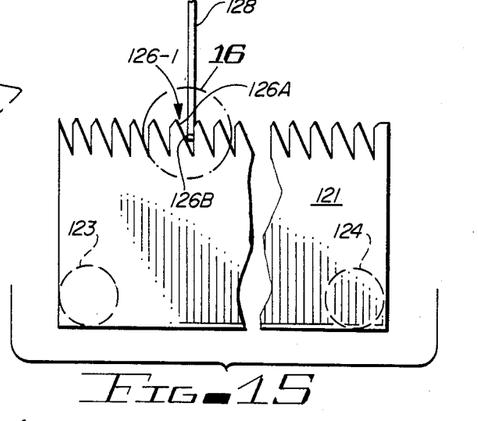
FIG. 15 is an enlarged side view of a portion of the diffusion boat of FIG. 13.

Referring now to FIG. 15, a partial, enlarged front view of boat 120 as shown in FIG. 13 is shown. More specifically, a wafer 128 is supported in groove 126-1, as also shown in FIG. 14. Reference numeral 126A again designates the sloped left surface, and reference numeral 126B designates the perfectly vertical right-hand wall of groove 126-1. It can be seen that the lower edge of wafer 128 is wedged between groove walls 126A and 126B. These features are shown more clearly in FIG. 16, which is an enlargement of detail 16 in FIG. 15.

Figure 16:
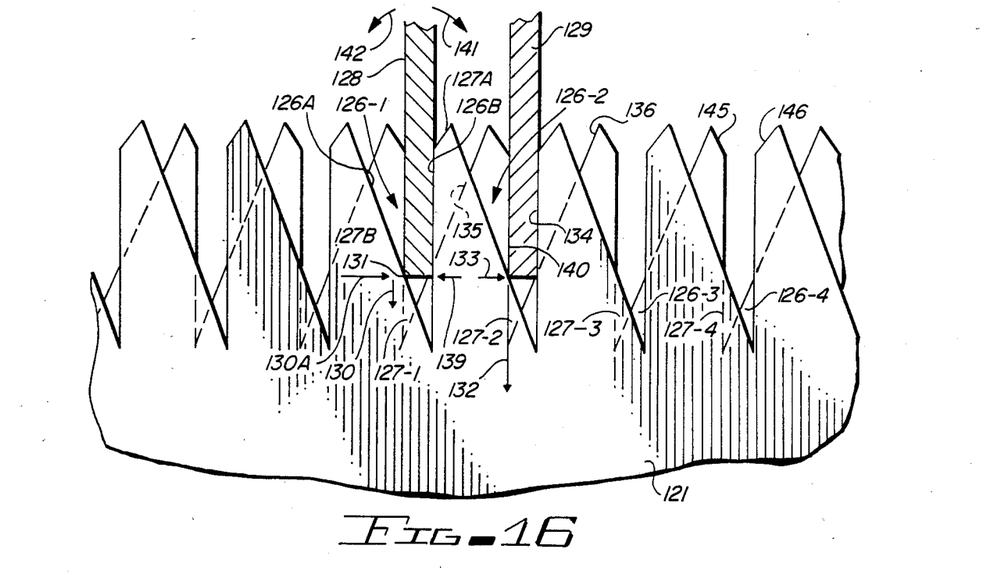
FIG. 16 is an enlarged illustration of detail 16 of FIG. 15.

Referring now to FIG. 16, not only front rail 121 and a plurality of wafer supporting grooves such as 126 therein are shown, but also some of the wafer supporting grooves in both front rail 121 and rear rail 122 are shown. More specifically, wafer supporting grooves 126-1, 126-2, 126-3 and 126-4 in front rail 121 are shown, wafers 128 and 129 being supported in grooves 126-1 and 126-2, respectively. Similarly, grooves 127-1, 127-2 and 127-3 in rear rail 122 are shown, wafers 128 and 129 being supported in grooves 127-1 and 127-2, respectively. From FIG. 16, it is more clearly seen that each of the grooves in rail 121 has a sloped left-hand wall and a flat perfectly vertical right-hand wall. It can also be seen that the lower left edge of each of the wafers in their respective grooves tends to slide down the flat sloped left-hand surface of the grooves 126, forcing the right-hand face of the wafers against the vertical right-hand wall of those grooves. For example, the lower left-hand edge of wafer 128 contacts sloped left-hand groove wall 126A at point 131. The downward force of the weight of wafer 128 on point 131 is indicated by arrow 130. A horizontal component of force caused in response to downward force 130 on sloped surface 126A in the right-hand direction is designated by arrow 130A. The horizontal force 130A forces the lower right-hand peripheral face portion of wafer 128 against flat, vertical groove wall 126B.

Similarly, the weight of wafer 129 applied to its lower left edge, as shown in FIG. 16 is designated by arrow 132, results in a horizontal component of force in the right-hand direction indicated by arrow 133. This forces the lower peripheral portion of the right-hand face of wafer 129 against vertical wall 134 of groove 126-2.

Next, the forces upon the lower left-hand edges of wafers 128 and 129 caused by the sloping right-hand wall 135 of groove 127-1 of rear rail 122 and by the right-hand sloped wall 136 of groove 127-2 of rear rail 122 will be described.

The weight of wafer 128 causes a downward force to be applied at its contact point 137 (FIG. 14) on surface 135. The tendancy of this point of wafer 128 to slide downward on sloped surface 127B produces a horizontal force in the direction of arrow 139, forcing the right-hand lower peripheral face of wafer 128 against vertical wall 127B of groove 127-1. Similarly, the downward force on the right-hand lower edge portion of wafer 129 in groove 127-2 forces the left lower peripheral right-hand face of wafer 129 against vertical wall 140 of groove 127-2. At this point, it can be seen that the flat, vertical groove walls such as 126B of grooves 126 in the front rail 121 lie in planes that are parallel to (but offset by the thickness of the wafers to be carried) the planes of corresponding flat, vertical groove walls such as 127B of grooves 127 of rear rail 122.

Thus, wafer 128 is tightly and perfectly vertically held in place in grooves 126-1 and 127-1. Vertical wall 127B prevents wafer 128 from tilting in the direction of arrow 142, and vertical wall 126B resists tilting of wafer 128 in the direction of 141 (for the reasons explained earlier with reference to FIG. 9).

Similarly, the opposed, offset vertical walls of front rail groove 126-2 and rear vertical groove wall 140 prevent wafer 129 from tilting in either direction. Thus, wafers 128 and 129, and all other wafers positioned in the various corresponding grooves 126 and 127, are held perfectly vertical in secure, precise parallel relationship to each other. This minimizes or prevents rattling of the wafers and minimizes resulting frictional rubbing of the edges of the semiconductor wafers such as 128 and 129 against the various wall of the grooves in boat 120, thereby minimizing or eliminating production of minute, silicon dust particles and quartz, silicon carbide, or polycrystalline silicon dust particles from the boat 120 (depending on which of these materials the boat 120 is formed of). The precisely parallel position in which all of the wafers are held results in very uniform flow of gases through the wafers in boat 120 during diffsion and oxidation operations, thereby resulting in greater uniformity in the yields of the wafers.

At this point, FIGS. 9 and 10 should be compared with FIG. 16, recalling that FIGS. 9 and 10 illustrate the grooves in the groves 43 and 44 and the elevator members 38 and 39, respectively, of the wafer transport apparatus of FIG. 7. Now, suppose that wafer 128 is wafer 15 in FIGS. 9 and 10. Suppose that boat 120 has been placed on the stand 134 (FIG. 7) and that wafers initially in the boat 120 are being lifted out of it by elevator members 38 and 39. It can be seen that if the sloped groove wall surfaces (such as 52 in FIG. 9 and 75 in FIG. 10) of both the boat 120 and elevator members 38 and 39 tend to urge the wafer being lifted out of boat 120 in the same horizontal directions, large forces will press wafers such as 128 and 129 (FIG. 16) to the right against vertical groove walls such as 126B and 134, possibly causing damage to integrated circuitry located on the peripheral portion of wafer 128. Accordingly, if boat 120 is to be used in conjunction with wafer transfer machine 30, its direction of the sloped walls and the grooves of boat 120 are reversed from the directions shown in FIGS. 13–16. This will cause the lower peripheral edges of the wafers to be urged away from, rather than against the vertical walls of the grooves 126 and 127 in boat 120 when the lower edges of the wafer are contacted by the sloped walls 75 and 52 (FIGS. 9 and 10) of the wafer supporting grooves of elevator members 38 and 39.

Note that the wafer supporting grooves in boat 120 have been shown in FIGS. 13–16 to be generally triangular, rather than having the precise shape of grooves shown in FIGS. 9 and 10. Actually, the modified triangular shape of FIGS. 9 and 10 is somewhat preferable to the triangular shape shown in FIGS. 13–16, but the triangular shape has been used in boat 120 because it is necessary to allow enough room for the tip of a hydrogen torch to be moved through each of the grooves 126 and 127 in order to highly "polish" the surfaces of the walls of these grooves during manufacture of boats of quartz. Initially, the grooves are cut by means of a precision saw, which leaves somewhat rough groove wall surfaces. This is undesirable because it increases the friction between those surfaces and the edges of wafers carried to boat 120. Accordingly, in manufacture of quartz boats 120 the top of a hydrogen torch is passed through each of the grooves 126, 127 in order melt and thereby smooth any microscopic imperfections in the surfaces of the groove walls, to thereby minimize friction with the wafers and resulting production of silicon dust and quartz dust.

The precise dimensions of the grooves of boat 120 are not given, as they depend on the size of the particular wafers to be carried. However, those skilled in the art of making diffusion boats can readily provide suitable dimensions. The dimensions given earlier with reference to FIGS. 9 and 10 are illustrative of typical dimensions that can be used. The sloped surfaces 145 and 146 at the top of the grooves are shown in FIG. 16 simply ease positioning of wafers into the correct grooves.

While a particular embodiment of the invention has been described in detail, those skilled in the art will be able to make various modifications to the described embodiment of the invention and the method of operation thereof without departing from the true spirit and scope of the invention. It is intended that wafer carrying boats which are equivalent to the one described and claimed in the sense that their features and/or steps of operation perform substantially the same function in substantially the same way to obtain substantially the same result are within the scope of the invention. For example, other wafer carrying boats, such as plastic boats, for causing wafers during low temperature semiconductor operations could be provided with grooves in accordance with those described in the quartz, silicon carbide, and polycrystalline boats. Furthermore, the sloped groove walls do not need to be precisely flat; they could be slightly concave. Metal boats or wafers carriers made in accordance with the invention are also useful in certain instances.

I claim:

1. A boat for carrying thin semiconductor wafers, said boat comprising ih combination:
    (a) first and second spaced, parallel rails, each having a longitudinal axis;
    (b) means for rigidly connecting said first and second rails together in fixed relationship to each other;
    (c) a first group of generally parallel wafer supporting grooves disposed in uniformly spaced relationship in an upper surface of said first rail, said wafer supporting grooves of said first group being generally perpendicular to said longitudinal axis of said first rail; and
    (d) a second group of generally parallel wafer supporting grooves disposed in uniformly spaced relationship in an upper surface of said second rail, said wafer supporting grooves of said second group being generally perpendicular to said longitudinal axis of said second rail, each wafer supporting groove of said first group being aligned with a corresponding wafer supporting groove of said second group to cooperate therewith in engaging lower edge portions of a semiconductor wafer to support that semiconductor wafer,
    wherein, a first wafer supporting groove of said first group includes a first flat, vertical groove wall surface for engaging a first peripheral portion of a first face of a first semiconductor wafer and a first steeply inclined groove wall surface opposed to said first flat vertical groove wall surface for supporting an edge point of a second face of said first wafer and exerting a horizontal force on said first semiconductor wafer, due to the weight of said first semiconductor wafer, to urge said first peripheral portion of said first face tightly against said first flat, vertical groove wall surface of said first wafer supporting groove of said first group, and
    wherein a first wafer supporting groove of said second group includes a second flat, vertical groove wall surface for engaging a second peripheral portion of said second face of said first semiconductor wafer and a second steeply inclined groove wall surface opposed to said second flat, vertical groove wall surface for supporting an edge point of said first face of said first semiconductor wafer and exerting a horizontal force on said first semiconductor wafer, due to the weight of said first wafer, to urge said second peripheral portion of said second face tightly against said second flat, vertical groove wall surface of said first wafer supporting groove of said second group, whereby said first wafer is held firmly in a precisely vertical position by said first wafer supporting grooves of said first and second groups, respectively.

2. The boat of claim 1 wherein an angle between the plane of said first steeply inclined groove wall surface and the plane of said first flat, vertical groove wall surface is approximately twenty degrees and an angle between the plane of said second steeply inclined groove wall surface and said second flat, vertical groove wall surface is also approximately twenty degrees.

3. The boat of claim 1 composed of material selected from the group consisting of quartz, silicon carbide and polycrystalline silicon.

4. The boat of claim 1 composed of plastic material.

5. The boat of claim 1 composed of metal.

6. The boat of claim 1 wherein all of said wafer supporting grooves of said first group are essentially identical to said first wafer supporting groove of said first group and wherein all of said wafer supporting grooves of said second group are essentially identical to said first wafer supporting groove of said second group.

7. The boat of claim 6 wherein all of said wafer supporting grooves are substantially triangular in shape so as to allow the top of a hydrogen torch to enter those grooves to melt and thereby smooth minute imperfections on the surface of the groove walls of said wafer supporting grooves to thereby minimize friction with edges of wafers.

8. The boat of claim 1 wherein the bottoms of said first and second wafer supporting grooves are generally sloped so that said edge point of said second face of said first semiconductor wafer contacts the first steeply inclined groove wall surface of said first wafer support groove of said first group along the length of said first wafer supporting groove of said first group and said edge point of said first face of said first semiconductor wafer contacts the first steeply inclined groove wall surface of said first wafer supporting groove of said second group along the length of said first wafer supporting groove of said second group.

9. The boat of claim 1 wherein the slopes of said first steeply inclined groove wall surfaces of said first and second groups are selected to optimize the securing of semiconductor wafers into precisely vertical, parallel positions as lower edges of those semiconductor wafers are moved into respective, corresponding wafer supporting grooves of said first and second groups.

10. A method of carrying thin semiconductor wafers in precise spaced parallel relationship to each other by, for each wafer,
(a) engaging a lower edge of a first face of each of said wafers with a respective steeply inclined groove wall surface of a respective groove of a first group so that the weight of that wafer causes a lower peripheral flat portion of an opposite second face of that wafer to be forced against a respective rigid flat vertical groove wall surface, to prevent each of said wafers from tilting away from the respective flat vertical groove wall surfaces of said grooves of said first group; and
(b) also engaging a lower edge of a said second face of each of said wafers with a respective steeply inclined groove wall surface of a respective groove of a second group so that the weight of that wafer causes a lower peripheral flat portion of said first face of that wafer to be forced against a respective rigid flat vertical groove wall surface, to prevent each of said wafers from tilting away from the respective flat vertical groove wall surfaces of said grooves of said second group.

11. The method of claim 10 including the step of lowering said wafers into said grooves of said first and second groups by means of a device having third and fourth groups of grooves for supporting lower peripheral portions of said wafers, the grooves of said third group being substantially similar to the grooves of said first group except that the relative orientations of said steeply inclined groove wall surfaces and flat vertical groove wall surfaces of said grooves of said third group are reversed so as to exert forces in generally opposed directions on lower edge portions of wafers to prevent the steeply inclined groove wall surfaces of grooves of said first group and said third group from both forcing the lower peripheral portions of said wafers against the respective flat vertical groove wall surfaces of the grooves of said first group, the grooves of said fourth group being substantially similar to the grooves of said second group except that the relative orientations of said steeply inclined groove wall surfaces and flat vertical groove wall surfaces of said grooves of said fourth group are reversed so as to exert forces in generally opposed directions on lower edge portions of wafers to prevent the steeply inclined groove wall surfaces of grooves of said second group and said fourth group from both forcing the lower peripheral portions of said wafers against the respective flat vertical groove wall surfaces of the grooves of said second group.

* * * * *